United States Patent
Jang et al.

(10) Patent No.: US 9,029,911 B2
(45) Date of Patent: May 12, 2015

(54) LIGHT EMITTING DEVICE

(75) Inventors: Jung Hun Jang, Seoul (KR); Jeong Sik Lee, Seoul (KR); Seung Keun Nam, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/562,613

(22) Filed: Jul. 31, 2012

(65) Prior Publication Data

US 2013/0037819 A1 Feb. 14, 2013

(30) Foreign Application Priority Data

Aug. 10, 2011 (KR) .................. 10-2011-0079881
Aug. 16, 2011 (KR) .................. 10-2011-0081345

(51) Int. Cl.
*H01L 21/02* (2006.01)
*H01L 33/32* (2010.01)
*H01L 33/00* (2010.01)
*H01L 33/12* (2010.01)

(52) U.S. Cl.
CPC ............... *H01L 33/32* (2013.01); *H01L 33/007* (2013.01); *H01L 33/12* (2013.01); *H01L 2924/0002* (2013.01); *H01L 2224/48091* (2013.01); *H01L 2224/48247* (2013.01)

(58) Field of Classification Search
CPC ........................................ H01L 33/12
USPC ........................................... 257/190
See application file for complete search history.

(56) References Cited

U.S. PATENT DOCUMENTS

2010/0258814 A1* 10/2010 Hoshi et al. ................. 257/76

OTHER PUBLICATIONS

Ubukata, et al, "GaN growth on 150-mm-diameter (1 1 1) Si substrates," Journal of Crystal Growth, vol. 298, Jan. 2007, pp. 198-201, ISSN 0022-0248, 10.1016/j.jcrysgro.2006.10.147.*
Liu et al., "AlGaN layers grown on AlGaN buffer layer and GaN buffer layer using strain-relief interlayers," SPIE Proceedings vol. 6841, Solid State Lighting and Solar Energy Technologies, Editors, 68410S; DOI: 10.1117/12.756715.*
Lin et al., "Effects of AlxGa1-xN interlayer for GaN epilayer grown on Si substrate by metal-organic chemical-vapor deposition," J Vacuum Sci and Tech, B 28, 473 (2010).*
Fu et al., "Effects of AlN/GaN Superlattices on the Structural Properties of Al0.45Ga0.55N Grown on AlN/Sapphire Templates," J. of the Korean Physical Society, vol. 55, No. 6, Dec. 2009, pp. 2659-2661.*

* cited by examiner

*Primary Examiner* — Peniel M Gumedzoe
*Assistant Examiner* — Christopher Johnson
(74) *Attorney, Agent, or Firm* — KED & Associates, LLP

(57) ABSTRACT

Disclosed are a light emitting device, a method of manufacturing the light emitting device, a light emitting device package and a lighting system. The light emitting device includes a silicon substrate; a nitride buffer layer on the silicon substrate; and a gallium nitride epitaxial layer on the nitride buffer layer, wherein the nitride buffer layer includes a first nitride buffer layer having a first aluminum nitride layer on the silicon substrate and a first gallium nitride layer on the first aluminum nitride layer.

11 Claims, 7 Drawing Sheets

LIGHT EMITTING DEVICE

CROSS-REFERENCE TO RELATED APPLICATION

This application claims under 35 U.S.C. §119 to Korean Patent Application No. 10-2011-0081345 (filed Aug. 16, 2011) and Korean Patent Application No. 10-2011-0079881 (filed Aug. 10, 2011) which are hereby incorporated by reference in their entireties.

BACKGROUND

The embodiment relates to a light emitting device, a method of manufacturing the same, a light emitting device package, and a lighting system.

An LED (light emitting device) is an element that converts electric energy into a light energy. For instance, the LED can produce various colors by adjusting the compositional ratio of compound semiconductors.

According to the related art, an LED based on a nitride semiconductor, such as a GaN epitaxial layer, has been used.

Meanwhile, according to the related art, a sapphire substrate of a SiC (silicon carbide) substrate has been used extensively used for growing GaN. Recently, studies and research have been performed to use a silicon substrate having the price competitiveness as a substrate for growing GaN.

The silicon substrate is advantageous in terms of the price competitiveness, large-size, electric conductivity and thermal conductivity.

However, the silicon substrate represents the disadvantages in that many defects and cracks may exist in a GaN layer due to the great difference in lattice constant and thermal expansion coefficient between silicon (Si) and gallium nitride (GaN).

For instance, according to the related art, the crack is generated in a GaN epitaxial layer when the GaN has been grown on the silicon substrate due to the tensile stain, which is generated during the cooling process caused by the difference in thermal expansion coefficient between the GaN, which is grown under the high temperature, and the silicon substrate.

In addition, silicon (Si) of the silicon substrate may react with TMGa, which is an element of the GaN, to form gallium silicide, so that melt-back is formed on the surface of the silicon substrate.

BRIEF SUMMARY

The embodiment provides a light emitting device capable of preventing crack from being generated in a GaN epitaxial layer formed on a silicon substrate, a method of manufacturing the same, a light emitting device package, and a lighting system.

In addition, the embodiment provides a light emitting device capable of preventing melt-back when a GaN epitaxial layer is formed on a silicon substrate, a method of manufacturing the same, a light emitting device package, and a lighting system.

A light emitting device according to the embodiment includes a silicon substrate; a nitride buffer layer on the silicon substrate; and a gallium nitride epitaxial layer on the nitride buffer layer, wherein the nitride buffer layer includes a first nitride buffer layer and the first nitride buffer layer includes a first aluminum nitride layer on the silicon substrate, and a first gallium nitride layer on the first aluminum nitride layer.

A light emitting device according to the embodiment includes a silicon substrate; a nitride buffer layer on the silicon substrate; and a gallium nitride epitaxial layer on the nitride buffer layer, wherein the nitride buffer layer includes a first nitride buffer layer and a second nitride buffer layer on the first nitride buffer layer, the first nitride buffer layer includes a first aluminum nitride layer on the silicon substrate and a first gallium nitride layer on the first aluminum nitride layer, and the second nitride buffer layer includes a second lower aluminum nitride layer on the first gallium nitride layer, a second aluminum gallium nitride layer on the second lower aluminum nitride layer, a second upper aluminum nitride layer on the second aluminum gallium nitride layer, and a second gallium nitride layer on the second upper aluminum nitride layer.

DETAILED DESCRIPTION OF THE EMBODIMENTS

Hereinafter, a light emitting device, a method of manufacturing the same, a light emitting device package, and a lighting system according to the embodiment will be described with reference to accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Embodiment 1

Figure 1:
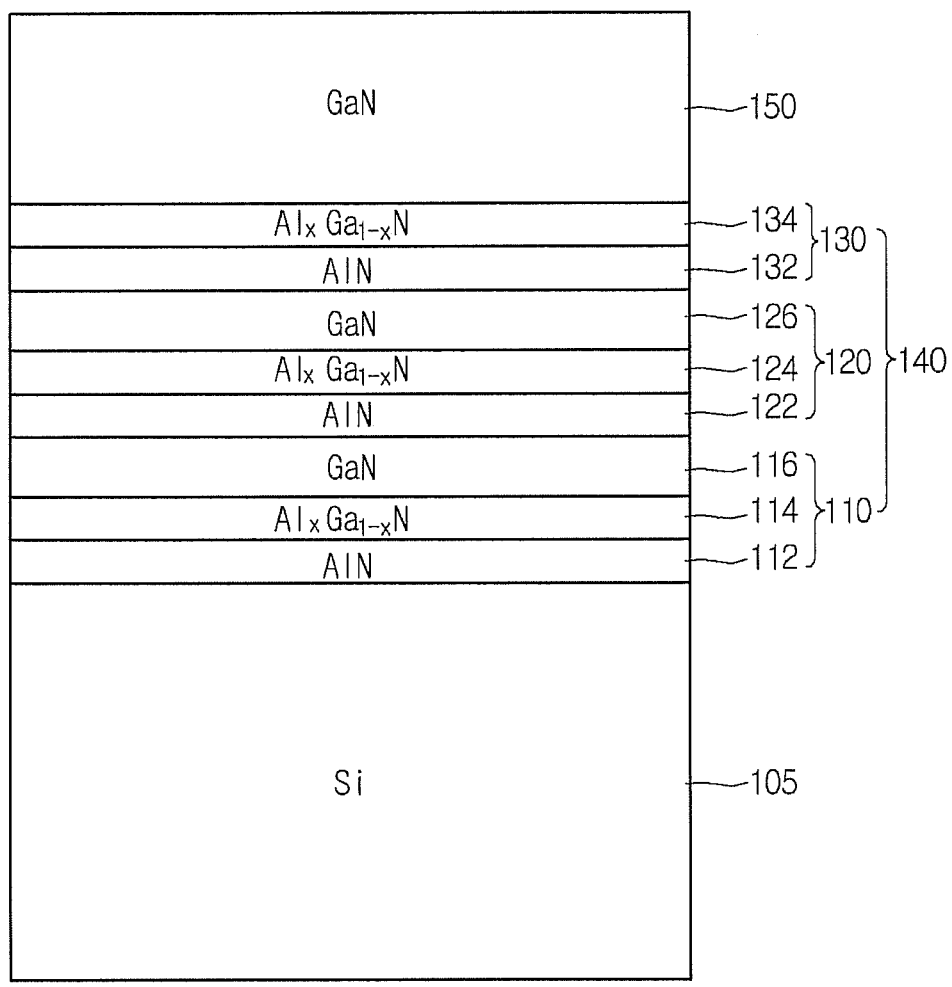
FIG. 1 is a sectional view of a light emitting device according to the first embodiment.

FIG. 1 is a sectional view of a light emitting device according to the first embodiment.

The light emitting device 100 according to the first embodiment may include a silicon (Si) substrate 105, a nitride buffer layer 140 formed on the silicon substrate 105, and a GaN epitaxial layer 150 formed on the nitride buffer layer 140.

According to the first embodiment, the nitride buffer layer 140 may have a plurality of periodicities. For instance, the nitride buffer layer 140 can be formed with two to five periodicities. In detail, the nitride buffer layer 140 may include a first nitride buffer layer 110 formed on the silicon substrate 105, a second nitride buffer layer 120 formed on the first nitride buffer layer 110, and a third nitride buffer layer 130 formed on the second nitride buffer layer 120, but the embodiment is not limited thereto.

The first nitride buffer layer 110 may include a first aluminum nitride layer 112 formed on the silicon substrate 105, a first aluminum gallium nitride layer 114 formed on the first aluminum nitride layer 112 and a first gallium nitride layer 116 formed on the first aluminum gallium nitride layer 114.

For instance, the first aluminum nitride layer 112 may be a first AlN layer, the first aluminum gallium nitride layer 114 may be a first $Al_xGa_{1-x}N$ layer (0<x<1), and the first gallium nitride layer 116 may be a first GaN layer, but the embodiment is not limited thereto.

Thus, the first nitride buffer layer 110 may include the first AlN layer 112 formed on the silicon substrate 105, the first $Al_xGa_{1-x}N$ layer (0<x<1) 114 formed on the first AlN layer 112, and the first GaN layer 116 formed on the first $Al_xGa_{1-x}N$ layer (0<x<1) 114, but the embodiment is not limited thereto.

The first embodiment may provide the light emitting device and the method of manufacturing the same, capable of preventing melt-back when the GaN epitaxial layer is formed on the silicon substrate.

According to the first embodiment, an AlN buffer layer may be formed on the silicon substrate 105. For instance, the first AlN layer 112 may be formed on the silicon substrate 105.

According to the related art, when the GaN epitaxial layer is directly grown on the silicon substrate, the melt-back may occur due to the eutectic reaction between Ga of the GaN epitaxial layer and Si of the silicon substrate.

The melt-back occurs at the surface of a wafer so that the epitaxial growth may be impossible. To solve the above problem, according to the first embodiment, the AlN buffer layer may be formed on the silicon substrate 105 to prevent the reaction between the Ga of the GaN epitaxial layer and the Si of the silicon substrate, thereby preventing the melt-back when the GaN epitaxial layer is formed on the silicon substrate.

In addition, the first embodiment provides the light emitting device and the method of manufacturing the same capable of preventing crack from being generated in the GaN epitaxial layer formed on the silicon substrate.

According to the related art, the crack can be generated in the GaN epitaxial layer when the GaN has been grown on the silicon substrate due to the tensile stain, which is generated during the cooling process caused by the difference in thermal expansion coefficient between the GaN, which is grown under the high temperature, and the silicon substrate.

According to the embodiment, in order to compensate for the tensile strain generated during the cooling process, compressive strain may be applied while the GaN epitaxial layer is being grown, thereby controlling the crack.

To this end, according to the embodiment, the $Al_xGa_{1-x}N$ layer (0<x<1) may be interposed as an AlGaN layer between the AlN buffer layer and the GaN layer.

According to the embodiment, since the $Al_xGa_{1-x}N$ layer is interposed between the AlN buffer layer and the GaN layer, compressive strain can be applied to the GaN layer, so that the strain transition is more effectively transferred to the GaN layer, thereby improving the surface morphology and preventing the melt-back.

In addition, the second nitride buffer layer 120 can be formed on the first nitride buffer layer 110. The second nitride buffer layer 120 may include a second AlN layer 122 formed on the first GaN layer 116 of the first nitride buffer layer 110, a second AlGaN layer 124 formed on the second AlN layer 122, and a second GaN layer 126 formed on the second AlGaN layer 124.

According to the first embodiment, the second AlN layer 122 may make contact with the top surface of the first GaN layer 116.

According to the embodiment, in order to control the crack generated during the cooling process, the second AlN layer 122 may make contact with the top surface of the first GaN layer 116.

Thus, the second AlN layer 122 may apply the compressive strain to the first GaN layer 116 to compensate for the tensile strain generated during the cooling process, thereby preventing the crack.

The third nitride buffer layer 130 can be formed on the second nitride buffer layer 120. The third nitride buffer layer 130 may include a third AlN layer 132 formed on the second GaN layer 126 of the second nitride buffer layer 120 and a third AlGaN layer 134 formed on the third AlN layer 132. The third nitride buffer layer 130 can be a same layer or a different layer from the second nitride buffer layer 120.

The nitride buffer layer 140 may have the three periodicities, but the embodiment is not limited thereto. For instance, the nitride buffer layer 140 may have two to five periodicities in such a manner that the compressive strain can be applied while the GaN epitaxial layer is being grown to compensate for the tensile strain generated during the cooling process, thereby controlling the crack.

The GaN epitaxial layer 150 can be formed on the nitride buffer layer 140. The GaN epitaxial layer 150 may include a first conductive semiconductor layer (not shown), an active layer (not shown), and a second conductive semiconductor layer (not shown), but the embodiment is not limited thereto.

Figure 2:
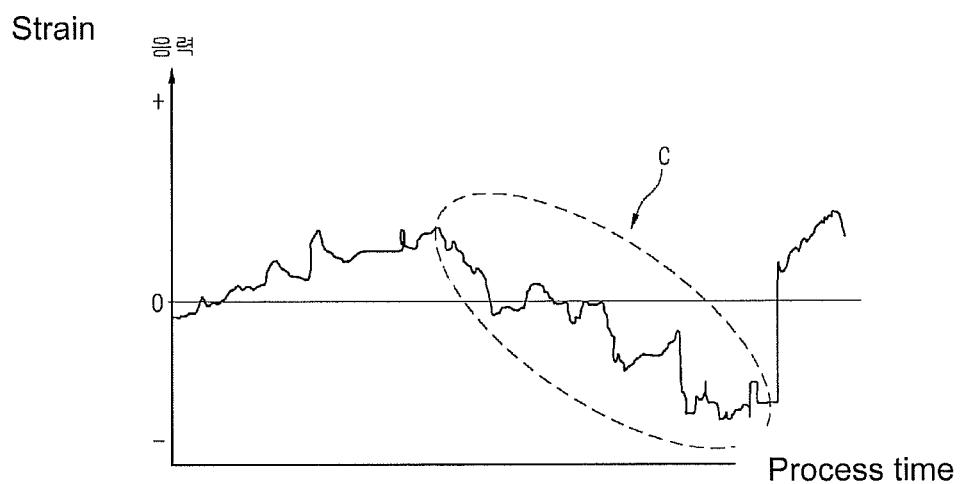
FIG. 2 is a graph showing a strain distribution of a light emitting device according to the embodiment.

FIG. 2 is a graph showing a strain distribution of the light emitting device according to the embodiment.

According to the light emitting device of the first embodiment, a compressive strain region (C) is defined to apply the compressive strain while the GaN epitaxial layer is being grown to compensate for the tensile strain generated during the cooling process, thereby controlling the crack.

To this end, according to the embodiment, the $Al_xGa_{1-x}N$ layer (0<x<1) may be interposed as an AlGaN layer between the AlN buffer layer and the GaN layer.

According to the embodiment, since the $Al_xGa_{1-x}N$ layer is interposed between the AlN buffer layer and the GaN layer, the compressive strain can be applied to the GaN layer, so that the strain transition is more effectively transferred to the GaN layer, thereby improving the surface morphology and preventing the melt-back.

According to the embodiment, in order to control the crack generated during the cooling process, the second AlN layer 122 of the second nitride buffer layer 120 may make contact with the top surface of the first GaN layer 116 of the first nitride buffer layer 110.

Thus, the second MN layer 122 applies the compressive strain to the first GaN layer 116 to compensate for the tensile strain generated during the cooling process, thereby preventing the crack.

The embodiment provides the light emitting device and the method of manufacturing the same capable of preventing the crack from being generated in the GaN epitaxial layer formed in the silicon substrate.

In addition, the embodiment provides the light emitting device capable of preventing the melt-back when the GaN epitaxial layer is formed on the silicon substrate, and the method of manufacturing the same.

Figure 3:
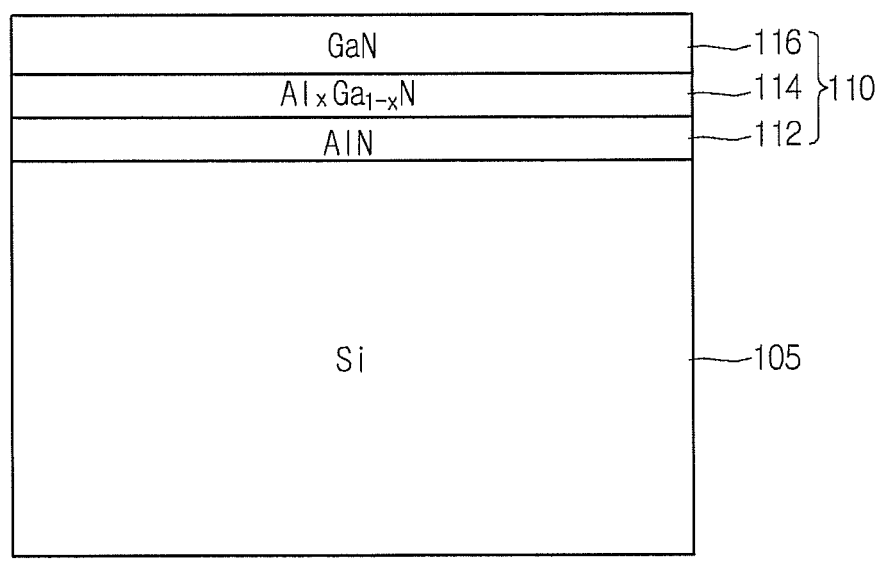
FIGS. 3 to 5 are sectional views showing the procedure for manufacturing a light emitting device according to the first embodiment.

Hereinafter, the method of manufacturing the light emitting device according to the first embodiment will be described with reference to FIGS. 3 to 5.

First, the silicon substrate 105 may be prepared. The silicon substrate may have the face orientation of {111} to minimize the lattice mismatch between the silicon substrate and the GaN epitaxial layer, but the embodiment is not limited thereto. A cleaning process can be performed with respect to the surface of the silicon substrate 105. After that, the nitride buffer layer 140 is formed on the silicon substrate 105.

According to the embodiment, the nitride buffer layer 140 has a plurality of periodicities. For instance, the nitride buffer layer 140 can be formed with two to five periodicities. In detail, the nitride buffer layer 140 may include the first nitride buffer layer 110 formed on the silicon substrate 105, the second nitride buffer layer 120 formed on the first nitride buffer layer 110, and the third nitride buffer layer 130 formed on the second nitride buffer layer 120, but the embodiment is not limited thereto.

The first nitride buffer layer 110 may include the first aluminum nitride layer 112 formed on the silicon substrate 105, the first aluminum gallium nitride layer 114 formed on the first aluminum nitride layer 112 and the first gallium nitride layer 116 formed on the first aluminum gallium nitride layer 114.

For instance, the first aluminum nitride layer 112 may be the first AlN layer, the first aluminum gallium nitride layer 114 may be the first $Al_xGa_{1-x}N$ layer (0<x<1), and the first gallium nitride layer 116 may be the first GaN layer, but the embodiment is not limited thereto.

Thus, the first nitride buffer layer 110 may include the first AlN layer 112 formed on the silicon substrate 105, the first $Al_xGa_{1-x}N$ layer (0<x<1) 114 formed on the first AlN layer 112, and the first GaN layer 116 formed on the first $Al_xGa_{1-x}N$ layer (0<x<1) 114, but the embodiment is not limited thereto.

According to the embodiment, the AlN layer may be formed on the silicon substrate 105 to prevent the reaction between the Ga of the GaN epitaxial layer and the Si of the silicon substrate, thereby preventing the melt-back when the GaN epitaxial layer is formed on the silicon substrate. For instance, the first AlN layer 112 can be formed on the silicon substrate 105.

The first AlN layer 112 may have the thickness of about 10 Å to about 200 Å to prevent Ga atoms used in the subsequent process from penetrating into the silicon substrate 105 through the melt-back phenomenon. The first AlN layer 112 can be formed under the temperature of about 1100° C. to about 1300° C. The first AlN layer 112 can be formed by supplying nitride, such as $NH_3$, onto an Al layer, but the embodiment is not limited thereto.

The first $Al_xGa_{1-x}N$ layer (0<x<1) 114 may be formed in the hydrogen atmosphere under the temperature of about 1100° C. to about 1300° C. and has a thickness of about 100 Å to about 600 Å to prevent Ga atoms from penetrating into the silicon substrate 105 through the melt-back phenomenon. In addition, the first $Al_xGa_{1-x}N$ layer (0<x<1) 114 may attenuate the strain caused by the lattice mismatch and difference in thermal expansion coefficient between the silicon substrate 105 and the GaN epitaxial layer. The composition (x) of Al may be set to 0.1<x<0.5 to prevent the melt-back phenomenon and to effectively attenuate the strain caused by the lattice mismatch and difference in thermal expansion coefficient between the silicon substrate 105 and the GaN epitaxial layer, but the embodiment is not limited thereto.

The first $Al_xGa_{1-x}N$ layer (0<x<1) 114 can be formed through a CVD (Chemical Vapor Deposition) scheme, an MBE (Molecular Beam Epitaxy) scheme, a sputtering scheme or an HVPE (Hydride Vapor Phase Epitaxy) scheme, but the embodiment is not limited thereto.

According to the embodiment, in order to compensate for the tensile strain generated during the cooling process, compressive strain is applied while the GaN epitaxial layer is being grown, thereby controlling the crack.

To this end, according to the embodiment, the $Al_xGa_{1-x}N$ layer (0<x<1) may be interposed as an AlGaN layer between the AlN buffer layer and the GaN layer.

According to the embodiment, since the $Al_xGa_{1-x}N$ layer is interposed between the AlN buffer layer and the GaN layer, the compressive strain can be applied to the GaN layer, so that the strain transition is more effectively transferred to the GaN layer, thereby improving the surface morphology and preventing the melt-back.

The first GaN layer 116 can be formed by supplying a Ga source and a nitride source in the temperature of about 800° C. to about 1000° C. The first GaN layer 116 can remove the crystal detect of the GaN epitaxial layer 150 formed above the first GaN layer 116 so that the quality of the GaN layer can be improved. The first GaN layer 116 can be formed with a thickness of about 100 Å to about 500 Å by taking the melt-back phenomenon and the quality of the GaN layer into consideration, but the embodiment is not limited thereto.

The first GaN layer 116 can be formed through a CVD (Chemical Vapor Deposition) scheme, an MBE (Molecular Beam Epitaxy) scheme, a sputtering scheme or an HVPE (Hydride Vapor Phase Epitaxy) scheme, but the embodiment is not limited thereto.

Figure 4:
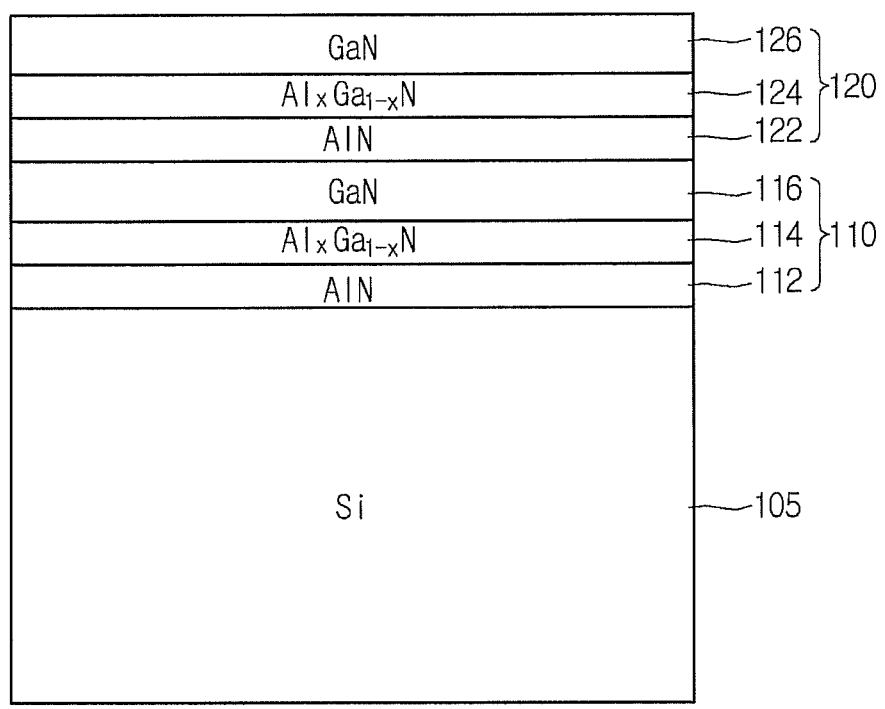

Then, as shown in FIG. 4, the second nitride buffer layer 120 may be formed on the first nitride buffer layer 110.

The second nitride buffer layer 120 may include the second AlN layer 122 formed on the first GaN layer 116 of the first nitride buffer layer 110, the second AlGaN layer 124 formed on the second AlN layer 122, and the second GaN layer 126 formed on the second AlGaN layer 124.

The second AlN layer 122, the second AlGaN layer 124 and the second GaN layer 126 can be formed by adopting the process for forming the first AlN layer 112, the first AlGaN layer 114 and the first GaN layer 116.

Therefore, the second nitride buffer layer 120 may include the second AlN layer 122 formed on the first GaN layer 116, the second $Al_xGa_{1-x}N$ layer (0<x<1) 124 formed on the second AlN layer 122, and the second GaN layer 126 formed on the second $Al_xGa_{1-x}N$ layer (0<x<1) 124.

According to the embodiment, the second AlN layer 122 makes contact with the top surface of the first GaN layer 116.

According to the embodiment, in order to control the crack generated during the cooling process, the second AlN layer 122 makes contact with the top surface of the first GaN layer 116.

Thus, the second AlN layer 122 applies the compressive strain to the first GaN layer 116 to compensate for the tensile strain generated during the cooling process, thereby preventing the crack.

Figure 5:
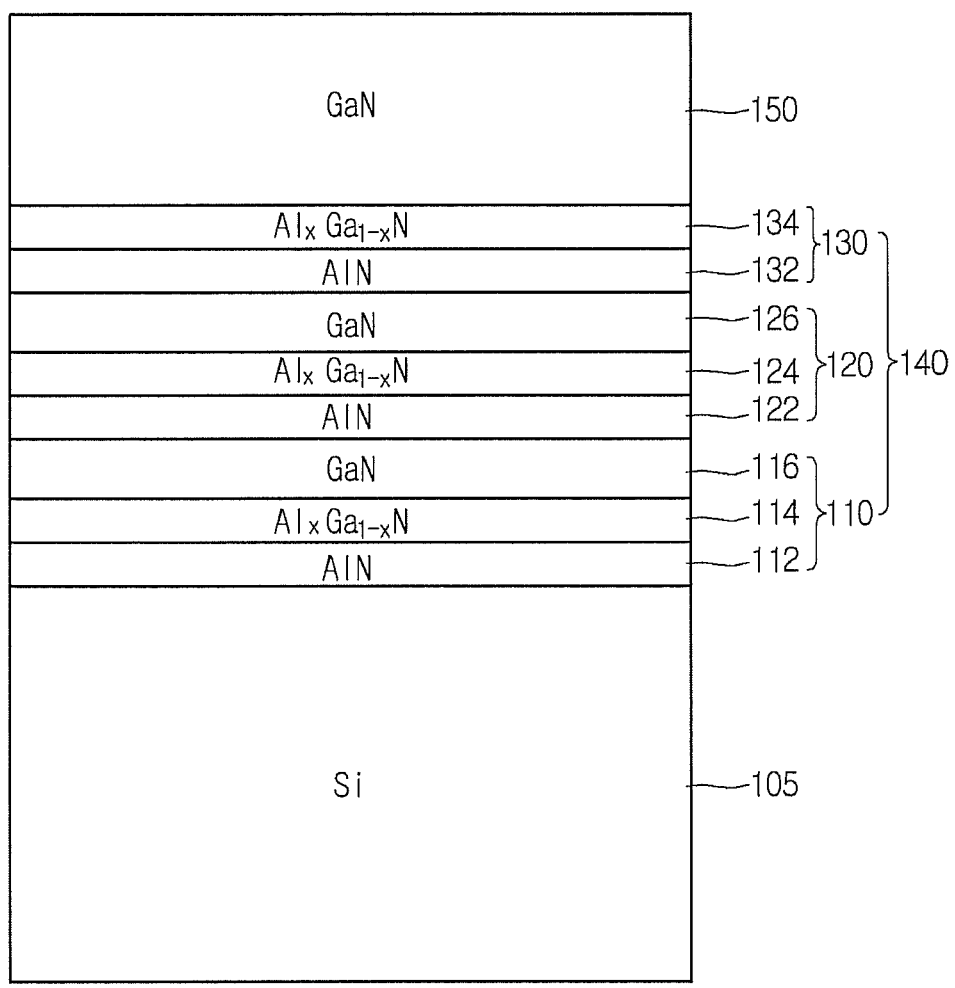

Then, as shown in FIG. 5, the third nitride buffer layer 130 can be formed on the second nitride buffer layer 120. The third nitride buffer layer 130 may include the third AlN layer 132 formed on the second GaN layer 126 of the second nitride buffer layer 120 and the third AlGaN layer 134 formed on the third AlN layer 132.

The third AlN layer 132 and the third AlGaN layer 134 can be formed by adopting the process for forming the first AlN layer 112 and the first AlGaN layer.

Therefore, the third nitride buffer layer 130 may include the third AlN layer 132 formed on the second GaN layer 126 and the third $Al_xGa_{1-x}N$ layer (0<x<1) 134 formed on the third AlN layer 132.

After that, the GaN epitaxial layer 150 is formed on the nitride buffer layer 140.

The GaN epitaxial layer 150 may include the first conductive semiconductor layer (not shown), the active layer (not shown), and the second conductive semiconductor layer (not shown), but the embodiment is not limited thereto.

The first conductive semiconductor layer may include a compound semiconductor of group III-V elements doped with a first conductive dopant. If the first conductive semiconductor layer is an N type semiconductor layer, the first conductive dopant includes an N type dopant, such as Si, Ge, Sn, Se or Te, but the embodiment is not limited thereto.

The active layer may have at least one of a single quantum well structure, a multi-quantum well (MQW) structure, a quantum wire structure and a quantum dot structure.

The second conductive semiconductor layer may include a compound semiconductor of group III-V elements doped with a second conductive dopant. For instance, the second conductive semiconductor layer may include a semiconductor material having the compositional formula of $In_xAl_yGa_{1-x-y}N$ (0≤x≤1, 0≤y≤1, 0≤x+y≤1). If the second conductive semiconductor layer is a P type semiconductor layer, the second conductive dopant may include a P type dopant, such as Mg, Zn, Ca, Sr or Ba.

According to the embodiment, the first conductive semiconductor layer 112 is an N type semiconductor layer and the second conductive semiconductor layer 116 is a P type semiconductor layer, but the embodiment is not limited thereto. In addition, a semiconductor layer having polarity opposite to polarity of the second conductive semiconductor layer can be formed on the second conductive semiconductor layer. For instance, an N type semiconductor layer (not shown) may be formed on the second conductive semiconductor layer. Thus, the light emitting structure may have one of an N-P junction structure, a P-N junction structure, an N-P-N junction structure and a P-N-P junction structure.

A light emitting diode chip can be provided by forming a predetermined electrode layer on the light emitting device formed with the GaN epitaxial layer 150.

The embodiment can provide the light emitting device capable of preventing the crack from being generated in the GaN epitaxial layer formed on the silicon substrate, and the method of manufacturing the same.

In addition, the embodiment can provide the light emitting device capable of preventing the melt-back when the GaN epitaxial layer is formed on the silicon substrate, and the method of manufacturing the same.

Embodiment 2

Figure 6:
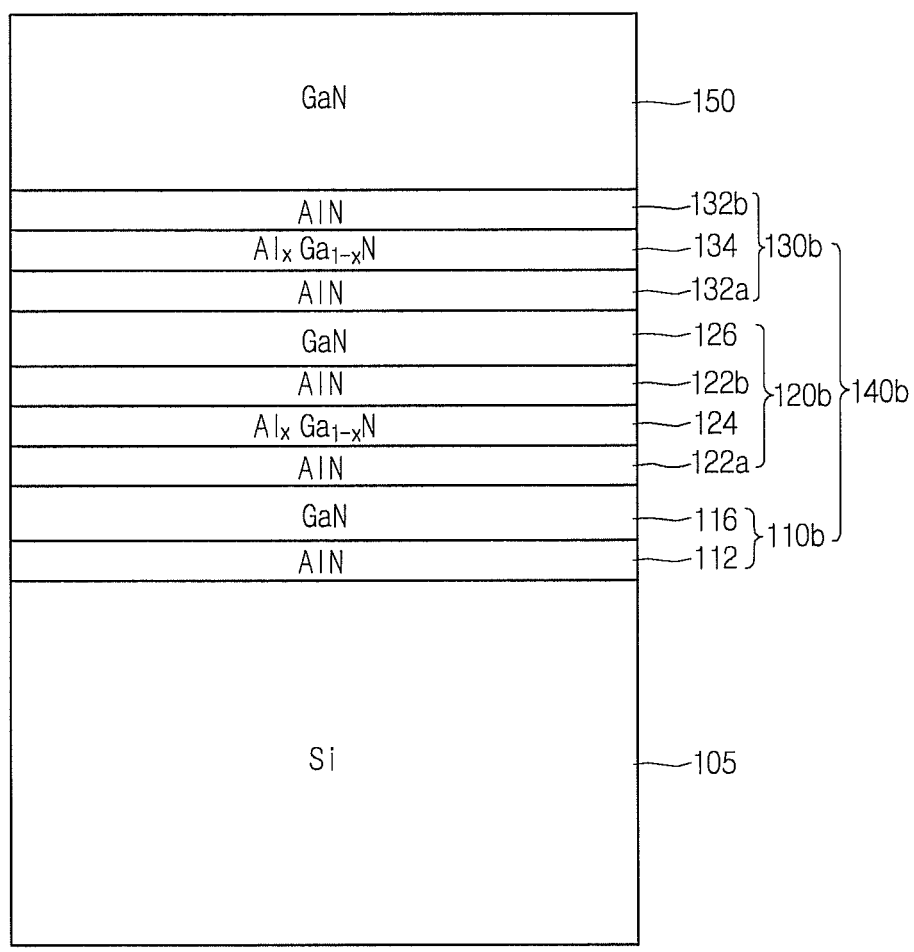
FIG. 6 is a sectional view of a light emitting device according to the second embodiment.

FIG. 6 is a sectional view of a light emitting device according to the second embodiment. The light emitting device according to the second embodiment may adopt the technical features of the light emitting device according to the first embodiment.

A first nitride buffer layer 110b according to the second embodiment may include the first aluminum nitride layer 112 formed on the silicon substrate 105 and the first gallium nitride layer 116 formed on the first aluminum nitride layer 112.

For instance, the first nitride buffer layer 110b may include the first AlN layer 112 formed on the silicon substrate 105 and the first GaN layer 116 formed on the first AlN layer 112.

According to the second embodiment, the nitride buffer layer 140b includes a second nitride buffer layer 120b formed on the first nitride buffer layer 110b and a third nitride buffer layer 130b formed on the second nitride buffer layer 120b. The third nitride buffer layer 130b can be a same layer or a different layer from the second nitride buffer layer 120b.

For instance, the second nitride buffer layer 120b may include a second lower AlN layer 122a formed on the first GaN layer 116, a second AlGaN layer 124 formed on the second lower AlN layer 122a, a second upper AlN layer 122b formed on the second AlGaN layer 124 and a second GaN layer 126 formed on the second upper AlN layer 122b.

In addition, the third nitride buffer layer 130b may include a third lower AlN layer 132a formed on the second GaN layer 126, a third AlGaN layer 134 formed on the third lower AlN layer 132a, and a third upper AlN layer 132 formed on the third AlGaN layer 134.

According to the second embodiment, the compressive strain can be effectively applied if the relaxation of the strain does not occur in the nitride buffer layer. Thus, according to the second embodiment, the $AlN/Al_xGa_{1-x}N/AlN$ sandwich structure is employed to diminish the strain relaxation, so that the compressive strain can be effectively applied.

The embodiment can provide the light emitting device capable of preventing the crack from being generated in the GaN epitaxial layer formed on the silicon substrate, and the method of manufacturing the same.

In addition, the embodiment can provide the light emitting device capable of preventing the melt-back when the GaN epitaxial layer is formed on the silicon substrate, and the method of manufacturing the same.

Figure 7:
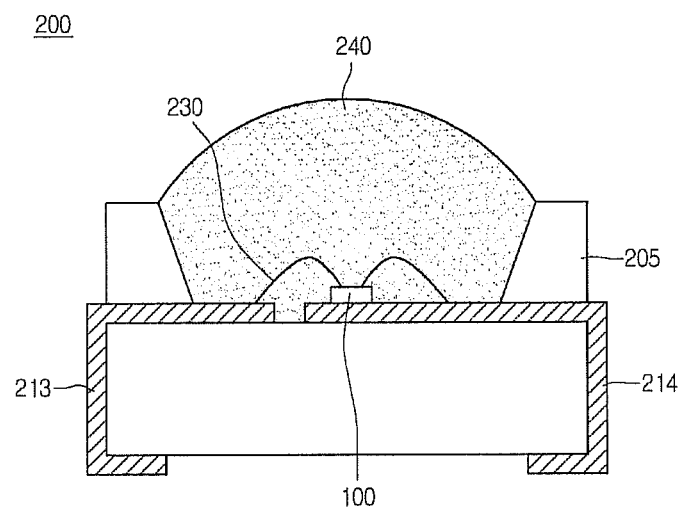
FIG. 7 is a sectional view showing a light emitting device package according to the embodiment.

FIG. 7 is a sectional view showing a light emitting device package 200 including the light emitting device according to the embodiment.

The light emitting device package 200 according to the embodiment includes a package body 205, third and fourth electrode layers 213 and 214 formed on the package body 205, the light emitting device 100 according to the embodiment, which is installed in the package body 205 and electrically connected to the third and fourth electrodes 213 and 214, and a molding member 240 surrounding the light emitting device 100.

The package body 205 may include silicon, synthetic resin, or metallic material. An inclined surface may be formed around the light emitting device 100.

The third and fourth electrode layers 213 and 214 are electrically insulated from each other and supply power to the light emitting device 100. The third and fourth electrode layers 213 and 214 may reflect light emitted from the light emitting device 100 to increase light efficiency, and may dissipate heat generated from the light emitting device 100 to the outside.

The light emitting device 100 may include a vertical type light emitting device shown in FIG. 1, but the embodiment is not limited thereto. For instance, the light emitting device 100 may include a lateral type light emitting device.

The light emitting device 100 may be mounted on the package body 205 or on the third electrode 213 or the fourth electrode 214.

The light emitting device 100 may be electrically connected with the third electrode 213 and/or the fourth electrode 214 through one of a wire scheme, a flip chip scheme and a die bonding scheme. According to the embodiment, the light emitting device 100 is electrically connected to the third electrode 213 through a wire 230 and directly makes contact with the fourth electrode 214.

The molding member 240 may protect the light emitting device 100 by surrounding the light emitting device 100. In addition, the molding member 240 may include phosphors to change the wavelength of light emitted from the light emitting device 100.

A plurality of light emitting device packages according to the embodiment may be arrayed on the substrate. In addition, optical members, such as a light guide plate, a prism sheet, a diffusion sheet, and a fluorescence sheet, may be installed on the path of a light emitted from the light emitting device package. The light emitting device package, the substrate and the optical members may serve as a backlight unit or a lighting unit. For example, a lighting system may include a backlight unit, a lighting unit, an indicator, a lamp, or a street lamp.

Figure 8:
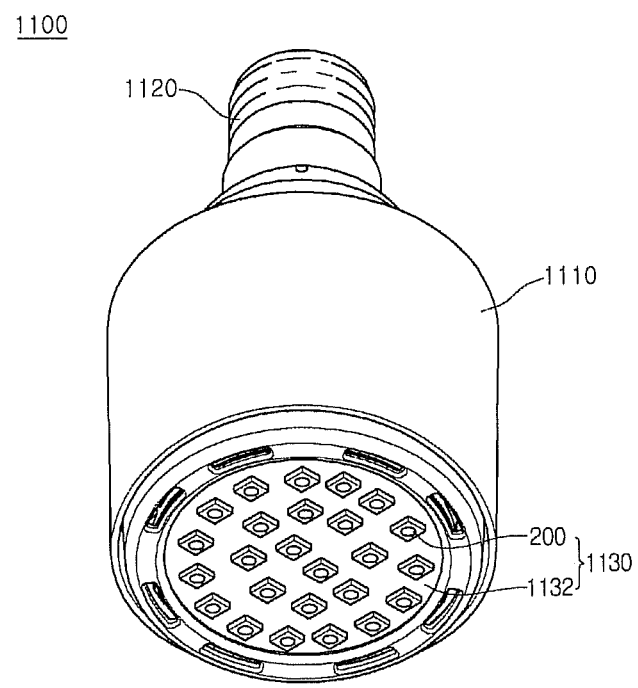
FIG. 8 is a perspective view showing a lighting unit according to the embodiment.

FIG. 8 is a perspective view showing a lighting unit 1100 according to the embodiment. The lighting unit 1100 of FIG. 8 is one example of a lighting system, and the embodiment is not limited thereto.

According to the embodiment, the lighting unit 1100 according to the embodiment may include a case body 1110, a light emitting module 1130 installed in the case body 1110, and a connection terminal 1120 installed in the case body 1110 to receive power from an external power source.

Preferably, the case body 1110 includes a material having a superior heat dissipation property. For example, the case body 1110 may include a metallic material or a resin material.

The light emitting module 1130 may include a substrate 1132 and at least one light emitting device package 200 installed on the substrate 1132.

The substrate 1132 may be formed by printing a circuit pattern on an insulator. For example, the substrate 1132 may include a PCB (Printed Circuit Board), a metal core PCB, a flexible PCB, or a ceramic PCB.

In addition, the substrate 1132 may include a material that effectively reflects the light. A coating layer may be formed on the surface of the substrate 1132. At this time, the coating layer has a white color or a silver color to effectively reflect the light.

At least one light emitting device package 200 is installed on the substrate 1132. Each light emitting device package 200 may include at least one LED (light emitting diode) 100. The LED 100 may include a color LED that emits the light having red, green, blue or white color and a UV (ultraviolet) LED that emits UV light.

The light emitting device package 200 of the light emitting module 1130 may be variously arranged to provide various colors and brightness. For instance, the combination of the white LED, the red LED and the green LED can be arranged to achieve the high color rendering index (CRI).

The connection terminal 1120 is electrically connected to the light emitting module 1130 to supply power to the light emitting module 1130. According to the embodiment, the connection terminal 1120 has a shape of a socket screw-coupled with the external power source, but the embodiment is not limited thereto. For instance, the connection terminal 1120 can be prepared in the form of a pin inserted into the external power source or connected to the external power source through a wire.

Figure 9:
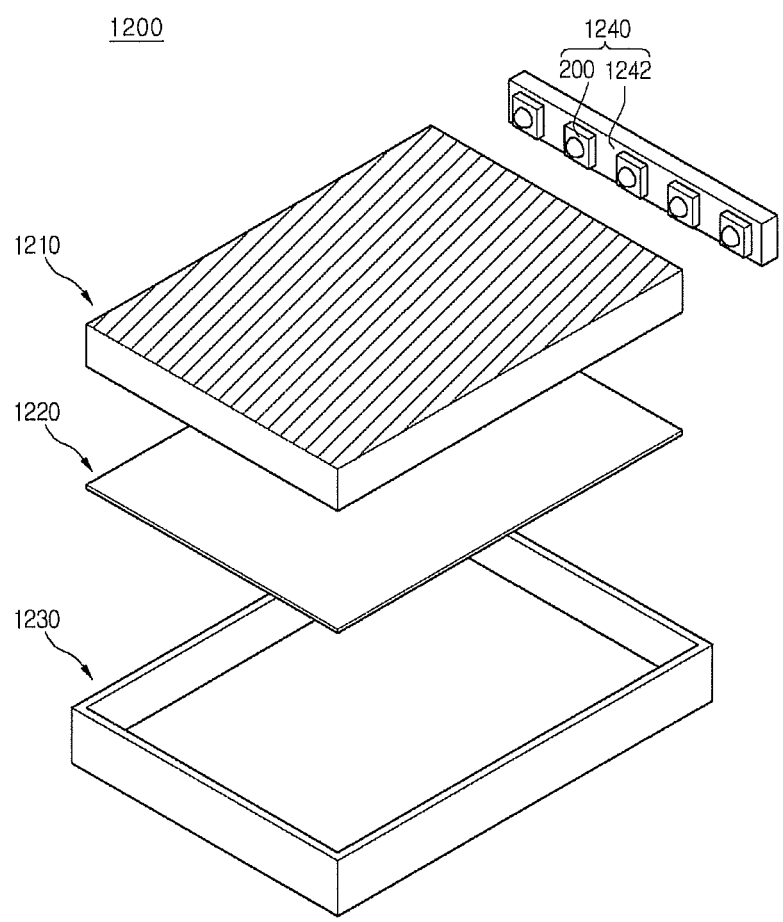
FIG. 9 is an exploded perspective view showing a backlight unit according to the embodiment.

FIG. 9 is an exploded perspective view of a backlight unit 1200 according to the embodiment. The backlight unit 1200 of FIG. 9 is an example of a lighting system, and the embodiment is not limited thereto.

The backlight unit 1200 according to the embodiment includes a light guide plate 1210, a light emitting module part 1240 to supply a light to the light guide plate 1210, a reflective member 1220 under the light guide plate 1210, and a bottom cover 1230 to receive the light guide plate 1210, the light emitting module part 1240, and the reflective member 1220 therein, but the embodiment is not limited thereto.

The light guide plate 1210 diffuses the light to provide surface light. The light guide plate 1210 may include a transparent material. For example, the light guide plate 1210 may include one of acryl-based resin, such as PMMA (polymethyl methacrylate), PET (polyethylene terephthalate), PC (polycarbonate), COC (cyclic olefin copolymer) or PEN (polyethylene naphthalate) resin.

The light emitting module part 1240 supplies the light to at least one side of the light guide plate 1210. The light emitting module part 1240 serves as the light source of the display device in which the backlight unit is installed.

The light emitting module part 1240 may make contact with the light guide plate 1210, but the embodiment is not limited thereto. In detail, the light emitting module part 1240 includes a substrate 1242 and a plurality of light emitting device packages 200 mounted on the substrate 1242. The substrate 1242 may make contact with the light guide plate 1210, but the embodiment is not limited thereto.

The substrate 1242 may be a printed circuit board (PCB) including a circuit pattern (not shown). In addition, the substrate 1242 may also include a metal core PCB (MCPCB) or a flexible PCB (FPCB), but the embodiment is not limited thereto.

In addition, the light emitting device packages 200 may be mounted on the substrate 1242 in such a manner that the light emission surface to emit the light is spaced apart from the light guide plate 1210 by a predetermined distance.

The reflective member 1220 may be disposed below the light guide plate 1210. The reflective member 1220 reflects the light, which travels downward through the bottom surface of the light guide plate 1210, upward, thereby improving the brightness of the backlight unit. For example, the reflective member 1220 may include PET, PC or PVC resin, but the embodiment is not limited thereto.

The bottom cover 1230 may receive the light guide plate 1210, the light emitting module part 1240, and the reflective member 1220 therein. To this end, the bottom cover 1230 has a box shape with an open top surface, but the embodiment is not limited thereto.

The bottom cover 1230 may be manufactured through a press process or an extrusion process by using a metallic material or a resin material.

The embodiment can provide the light emitting device capable of preventing the crack from being generated in the GaN epitaxial layer formed on the silicon substrate, the method of manufacturing the same, the light emitting device package, and the lighting system.

In addition, the embodiment can provide the light emitting device capable of preventing the melt-back when the GaN epitaxial layer is formed on the silicon substrate, the method of manufacturing the same, the light emitting device package, and the lighting system.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
    a silicon substrate;
    a nitride buffer layer on the silicon substrate; and
    a gallium nitride epitaxial layer on the nitride buffer layer,
        wherein the nitride buffer layer comprises a first nitride buffer layer, and the first nitride buffer layer comprises:
            a first aluminum nitride layer on the silicon substrate;
            a first aluminum gallium nitride layer on the first aluminum nitride layer; and
            a first gallium nitride layer on the first aluminum gallium nitride layer,
        wherein the first gallium nitride layer is directly disposed on the first aluminum gallium nitride layer,
        wherein the first aluminum gallium nitride layer is directly disposed on the first aluminum nitride layer, and
        wherein the first aluminum gallium nitride layer is disposed between a top surface of the first aluminum nitride layer and a bottom surface of the first gallium nitride layer,
    wherein the nitride buffer layer comprises a second nitride buffer layer on the first nitride buffer layer, and the second nitride buffer layer comprises:
        a second aluminum nitride layer on the first gallium nitride layer;
        a second aluminum gallium nitride layer on the second aluminum nitride layer; and
        a second gallium nitride layer on the second aluminum gallium nitride layer,
    wherein the nitride buffer layer comprises a third nitride buffer layer on the second nitride buffer layer, and
    the third nitride buffer layer comprises a third aluminum nitride layer on the second gallium nitride layer and a third aluminum gallium nitride layer on the third aluminum nitride layer.

2. The light emitting device of claim 1, wherein the second aluminum nitride layer of the second nitride buffer layer contacts a top surface of the first gallium nitride layer of the first nitride buffer layer.

3. The light emitting device of claim 1, wherein the first aluminum nitride layer has a thickness in a range of about 10 Å to 200 Å.

4. The light emitting device of claim 1, wherein the first aluminum gallium nitride layer has a thickness in a range of about 100 Å to 600 Å.

5. The light emitting device of claim 1, wherein the first gallium nitride layer has a thickness in a range of about 100 Å to 500 Å.

6. The light emitting device of claim 1, wherein the nitride buffer layer comprises two to five periodicities.

7. A light emitting device comprising:
    a silicon substrate;
    a nitride buffer layer on the silicon substrate; and
    a gallium nitride epitaxial layer on the nitride buffer layer,
        wherein the nitride buffer layer comprises a first nitride buffer layer and a second nitride buffer layer on the first nitride buffer layer,
        the first nitride buffer layer comprises a first aluminum nitride layer on the silicon substrate and a first gallium nitride layer on the first aluminum nitride layer, and
        the second nitride buffer layer comprises a second lower aluminum nitride layer on the first gallium nitride layer, a second aluminum gallium nitride layer on the second lower aluminum nitride layer, a second upper aluminum nitride layer on the second aluminum gallium nitride layer, and a second gallium nitride layer on the second upper aluminum nitride layer,
    wherein the first gallium nitride layer is directly disposed on the first aluminum nitride layer,
    wherein the second lower aluminum nitride layer is directly disposed on the first gallium nitride layer, and
    wherein the second aluminum gallium nitride layer is disposed between a top surface of the second lower aluminum nitride layer and a bottom surface of the second upper aluminum nitride layer.

8. The light emitting device of claim 7, further comprising a first aluminum gallium nitride layer on the first aluminum nitride layer.

9. The light emitting device of claim 7, wherein the first aluminum nitride layer has a thickness in a range of about 10 Å to 2 00 Å.

10. The light emitting device of claim 7, wherein the first aluminum gallium nitride layer has a thickness in a range of about 100 Å to 600 Å.

11. The light emitting device of claim 7, wherein the first gallium nitride layer has a thickness in a range of about 100 Å to 500 Å.

* * * * *